United States Patent [19]

Gusinov

[11] Patent Number: 5,455,705
[45] Date of Patent: Oct. 3, 1995

[54] TRANSIMPEDANCE AMPLIFIER FOR OPTICAL RECEIVER

[75] Inventor: Alex Gusinov, Brookline, Mass.

[73] Assignee: Analog Devices, Inc., Norwood, Mass.

[21] Appl. No.: 212,159

[22] Filed: Mar. 14, 1994

[51] Int. Cl.⁶ .................................................. H01J 40/14
[52] U.S. Cl. ....................... 359/189; 359/194; 250/214 A
[58] Field of Search ............................... 359/189, 194; 250/214 A

[56] References Cited

U.S. PATENT DOCUMENTS

| | | | |
|---|---|---|---|
| 5,008,524 | 4/1991 | Reutter et al. | 250/214 A |
| 5,138,148 | 8/1992 | Sakura | 250/214 A |
| 5,202,553 | 4/1993 | Geller | 250/214 A |
| 5,257,285 | 10/1993 | Thorp | 375/11 |
| 5,311,353 | 5/1994 | Crawford | 359/333 |
| 5,363,064 | 11/1994 | Mikomura | 330/308 |

*Primary Examiner*—Mark Hellner
*Attorney, Agent, or Firm*—Iandiorio & Teska

[57] ABSTRACT

A transimpedance amplifier for an optical receiver includes an integrator circuit for receiving a current input from a photodetector; an integrator capacitance between the input and output of the integrator circuit; a gain stage responsive to the output of the integrator circuit for providing an output voltage representative of the current input to the integrator circuit; and a feedback resistance connected between the output of the gain stage and the input of the integrator circuit for establishing the nominal gain of and in conjunction with the integrator circuit for setting the nominal bandwidth of the transimpedance amplifier; the gain stage may have a gain greater than unity for increasing the bandwidth by the factor of the gain and the gain stage may include a trimmable resistance for adjusting the gain both below and above unity.

9 Claims, 2 Drawing Sheets

TRANSIMPEDANCE AMPLIFIER FOR OPTICAL RECEIVER

FIELD OF INVENTION

This invention relates to an improved transimpedance amplifier for an optical receiver, and more particularly to such an amplifier with lower noise and a broad, tunable bandwidth.

BACKGROUND OF INVENTION

Conventional fiber optic receivers typically use a transimpedance amplifier to convert the current from the photodetector input device into a voltage. The transimpedance amplifier may include an integrator circuit including a Miller feedback integrator capacitance (C), which is partially or totally comprised of the parasitic capacitance of the integrator circuit itself. The output of the integrator circuit is delivered to a follower circuit which enables the signal to be delivered through a feedback resistor (R) to the input of the integrator circuit. There are two competing goals for such transimpedance amplifiers: one is broad bandwidth, the other is low noise. In order to minimize the noise in such amplifiers the feedback resistance is made as large as possible. Since the noise increases only as the square root of the resistance $V_{noise}=\sqrt{4KTR}$ (where $V_{noise}$ is the noise voltage density, K is Boltzmann's constant, R is the feedback resistance and T is the temperature), and the gain increases directly with R, the signal to noise ratio is improved by increasing R. However, since the bandwidth $$BW = \frac{1}{2\pi RC},$$

increasing the feedback resistance R decreases BW: doubling R will halve BW. In situations where a compromise value of R cannot be reached to obtain both the desired noise level and bandwidth other approaches must be used. For example, the value of C could be reduced to offset or even exceed the effect of the increase of R so that the desired bandwidth is achieved through reduction of C while the reduced noise level is achieved by the increase of R. This approach may require using a higher speed, lower capacitance silicon process, or a gallium arsenide process which increases dramatically the cost of the components.

Another problem is the difficulty in controlling the bandwidth. Typically, especially in demanding applications, the capacitance C and resistance R are formed within the integrated circuit and are not accessible for external tuning. Further, because of the variation in R and C which occurs as a part of the fabrication process, the actual value of each may vary ±20% from the nominal. A variation of 20% for each of R and C results in an overall bandwidth variation of ±44% calculated as $$\text{Bandwidth} = \frac{1}{2\pi RC}.$$

While the resistance R could be made physically large enough to trim in order to control bandwidth, this is not a viable option in most cases because the physically larger resistor would introduce more parasitic capacitance and would increase the noise at higher frequencies, the very thing sought to be avoided by including the resistor in the integrated circuit.

SUMMARY OF INVENTION

It is therefore an object of this invention to provide an improved transimpedance amplifier for an optical receiver.

It is a further object of this invention to provide such an improved transimpedance amplifier for an optical receiver which enables larger bandwidth.

It is a further object of this invention to provide such an improved transimpedance amplifier for an optical receiver which enables trimming to obtain a desired bandwidth.

It is a further object of this invention to provide such an improved transimpedance amplifier for an optical receiver which minimizes noise.

It is a further object of this invention to provide such an improved transimpedance amplifier for an optical receiver in which the bandwidth can be adjusted independently of the feedback resistance or integrating capacitance.

It is a further object of this invention to provide such an improved transimpedance amplifier for an optical receiver in which the noise level and the bandwidth can be set without interfering with each other.

It is a further object of this invention to provide such an improved transimpedance amplifier for an optical receiver in which the trimming device can be disposed external to the transimpedance unit.

The invention results from the realization that a low noise transimpedance amplifier with broad, tunable bandwidth can be effected by using a gain stage which has a gain greater than unity to increase the bandwidth, and which can be trimmed (via resistor) to adjust the bandwidth, all independent of the feedback resistance.

This invention features a transimpedance amplifier for an optical receiver which includes an integrator circuit for receiving a current input from a photodetector and an integrator capacitance between the input and the output of the integrator circuit. A gain stage is responsive to the output of the integrator circuit for providing an output voltage representative of the current input to the integrator circuit. A feedback resistance is connected between the output of the gain stage and the input of the integrator circuit for establishing the nominal gain of and in conjunction with the integrator capacitance for setting the nominal bandwidth of the transimpedance amplifier. The gain stage has a gain greater than unity for increasing the bandwidth by the factor of the gain.

In a preferred embodiment the gain stage may include a trimmable resistance to adjust the gain of the gain stage. The transimpedance amplifier may be fabricated as an integrated circuit and the trimmable resistance may be disposed in that integrated circuit, or it may be disposed external to it. In this configuration the trimmable resistance may be several orders of magnitude smaller than the feedback resistance, hence its interaction with parasitic capacitances moved several orders of magnitude out in frequency.

The invention also features a transimpedance amplifier for an optical receiver which includes an integrator circuit for receiving a current input from a photodetector and an integrator capacitance between the input and the output of the integrator circuit. The gain stage is responsive to the output of the integrator circuit for providing an output voltage representative of the current input to the integrator circuit. A feedback resistance is connected between the output of the gain stage and the input of the integrator circuit for establishing the nominal gain of, and in conjunction with the integrator capacitance for setting the nominal bandwidth of, the transimpedance amplifier. The gain stage includes a trimmable resistance for adjusting the gain of the gain stage for controlling the bandwidth of the transimpedance amplifier. The transimpedance amplifier may be fabricated as an integrated circuit and the trimmable resistance may be disposed in that integrated circuit or may be disposed external to that integrated circuit.

DISCLOSURE OF PREFERRED EMBODIMENT

Other objects, features and advantages will occur to those skilled in the art from the following description of a preferred embodiment and the accompanying drawings, in which.

The invention may be accomplished with a transimpedance amplifier for an optical receiver which includes an integrator circuit for receiving a current input from a photodetector such as a light-sensitive diode. There is an integrator capacitance which is connected between the input and the output of the integrator circuit. Together the integrator capacitance and the integrator circuit make an integrating system. There is a gain stage responsive to the output of the integrator circuit which provides an output voltage representative of the current input to the integrator circuit from the photodetector. A feedback resistance is connected between the output of the gain stage and the input of the integrator circuit for establishing the nominal gain of the transimpedance amplifier. The same feedback resistance in conjunction with the integrator capacitance and gain stage also sets the nominal bandwidth of the transimpedance amplifier. However, the gain stage may have a gain greater than one for increasing the bandwidth by the factor of the gain and may include a trimmable resistor which can be trimmed to adjust the gain of the gain stage and thereby adjust the bandwidth by the factor of that gain.

The noise introduced by feedback resistor R is expressed as $V_{noise}=\sqrt{4KTR}$, where $V_{noise}$ is the noise voltage density, K is Boltzmann's constant, R is feedback resistance, and T is the temperature. Thus it can be seen that increasing R only increases $V_{noise}$ by a factor of the $\sqrt{R}$ whereas in a transimpedance amplifier by definition increasing the R increases the gain proportionally. So for example, doubling R increases the gain by a factor of 2 but only increases the noise by a factor of $\sqrt{2}$. By increasing R sufficiently, the gap between the two expands and the signal to noise ratio is improved. However, since the bandwidth is equal to $1/2\pi RC$, where C is the integrator or Miller capacitance, increasing the feedback resistance R decreases the bandwidth, e.g., doubling R will halve the bandwidth. In accordance with this invention a gain stage is used immediately following the integrating stage so that a gain factor is introduced. Now the bandwidth is equal to $1/[2\pi RC/G]$, where G is the gain of the gain stage. Thus increasing the gain will increase the bandwidth and this can be done independently of changing the value of feedback resistance R which sets the noise level. Furthermore the gain could be controlled by trimming a gain setting resistance in the gain stage. Such a resistance can be made much smaller in value (approximately several orders of magnitude) than the feedback resistance, so that its interaction with parasitic capacitance is moved several orders of magnitude out in frequency. This property allows for the placement of the gain stage trimmable resistance outside the integrated circuit package without deleterious effect on the noise or stability of the fiber optic transimpedance amplifier.

Figure 1:
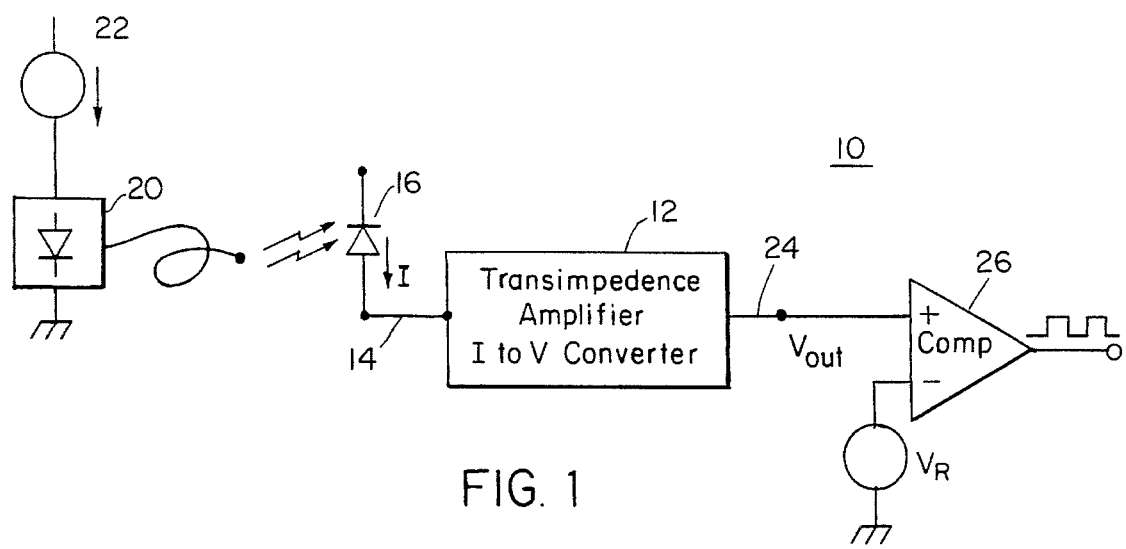
FIG. 1 is a schematic block diagram of an optical receiver system employing a transimpedance amplifier according to this invention.

There is shown in FIG. 1 an optical receiver system 10 including a transimpedance amplifier 12 according to this invention. Transimpedance amplifier 12 at its input 14 is connected to photodetector 16 which receives the optical input typically over a fiber optic network 18 which transmits light from a source such as laser diode 20 whose light output is pulsed by means of current source 22. Transimpedance amplifier 12 converts the current at input 14 representative of the optical input to photodetector 16 to a voltage at its output 24. That voltage, typically pulses representing two states: on and off, are delivered to a comparator or quantizer 26. The voltage at the output 24 of transimpedance amplifier 12 has a high state and a low state which when compared to reference $V_R$ in comparator 26 results in an output signal that is a digital high or low. The output from comparator 26 is delivered to further digital signal processing circuits.

Figure 2:
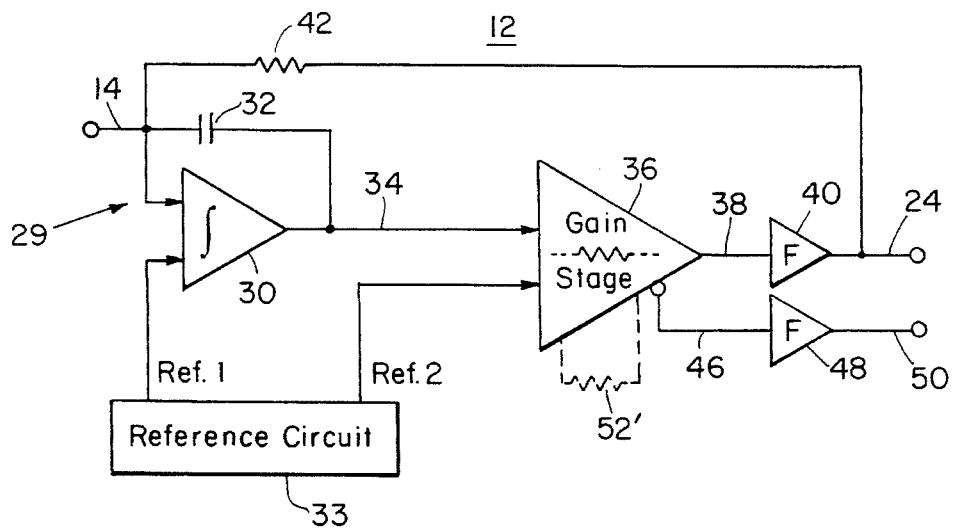
FIG. 2 is a more detailed schematic diagram of the transimpedance amplifier according to this invention as shown in FIG. 1.

Transimpedance amplifier 12, FIG. 2, includes integrator system 29 including an integrator amplifier or circuit 30 and integrator capacitor 32 known as a Miller capacitance, which may be partially or totally formed of the parasitic capacitance intrinsic in integrator circuit 30 itself. (Without integrator capacitor 32, integrator circuit 30 is not truly an integrator circuit.) The current signal at input 14 provides one input to integrator circuit 30. The other is ref. 1 from reference circuit 33. The output from integrator circuit 30 is fed on line 34 to gain stage 36. The other input to gain stage 36 is ref. 2 from reference circuit 33. The output voltage of gain stage 36 is delivered on line 38 to follower 40, which provides output 24. That same signal is fed back through feedback resistor 42 to the input of integrator circuit 30. If desired, the inverted output 46 from gain stage 36 may be fed to another follower 48 to provide the inverted output on output 50.

In accordance with this invention the noise level may be minimized independent of the optimization of the bandwidth. The noise level is controlled by varying the resistance of feedback resistor 42 in accordance with formula $V_{noise}=\sqrt{4KTR}$. By increasing R, the gain goes up directly as a factor of R, whereas the noise goes up only as the square root of R. Simultaneously, independently, the bandwidth can be controlled by varying the gain of gain stage 36 in accordance with the formula $$\text{Bandwidth} = \frac{1}{2\pi RC/G},$$

where R is the feedback resistor, C is the Miller integrator capacitor 32, and G is the gain of gain stage 36. Thus it can be seen that by increasing the gain, the bandwidth can be increased accordingly. Or if the gain is decreased the bandwidth will be decreased. In this way the bandwidth can be controlled and can be increased to any desired value. The gain of gain stage 36 in accordance with this invention is adjusted by trimming resistor 52, which may be internally contained within gain stage 36 or may be externally disposed as indicated at 52'.

The entire transimpedance circuit 12, FIG. 2, may be fabricated on a single integrated circuit chip, in which case the resistance 52 can be fabricated either as a resistor 52 which is on board or an external resistor 52' which is not on the chip. The adjustment can be done by laser trimming of the on board resistance 52 or by laser trimming or other means, for example a potentiometer, for off-board resistance 52'. Feedback resistor 42 is normally an order of magnitude of 10,000 ohms, whereas resistor 52, 52' is typically in the range of 100 ohms. This and the fact that resistance 52 or 52' is a part of the gain stage 36 enables it to be small, trimmable and even off-board without introducing the kind of noise that would be introduced by the use of feedback resistor 42 to control bandwidth. Because the resistance value of trimming resistance 52 or 52' is so small, approximately several orders of magnitude smaller, the parasitics associated with it, whether it be on-board or off, do not interfere with performance at the frequencies of operation. Any such noise is introduced at higher frequencies above the frequencies of concern. The other reason that the trimming resistance 52, 52' does not affect the noise level as much as feedback resistor 42 is that feedback resistor 42 is connected to the input of the transimpedance amplifier where sensitivity to noise is extremely high, whereas resistances 52 and 52' are in the subsequent gain stage where sensitivity is not nearly so high.

Figure 3:
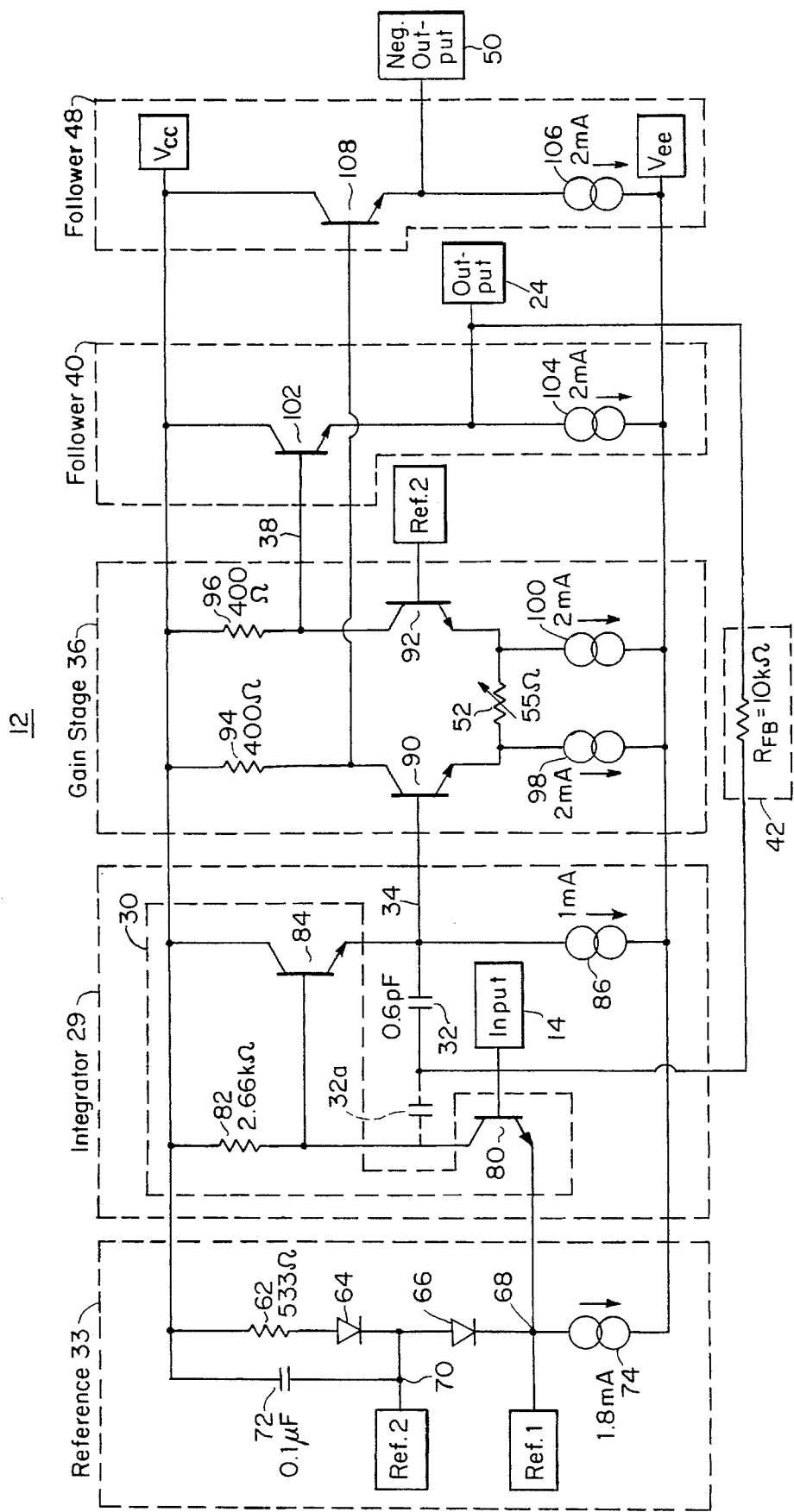
FIG. 3 is a more detailed schematic diagram of the transimpedance amplifier of FIG. 2.

As shown in more detail in FIG. 3, reference circuit 33 sets voltages at nodes 68 and 70. Reference 1 is provided at terminal 68 and reference 2 is provided at terminal 70. Capacitor 72 acts as a filter capacitor to filter out high-frequency signals from resistor 62 and diode 64. Also included in reference circuit 33 is current source 74. Integrator circuit 30 includes transistor amplifier 80, load resistor 82 and follower transistor amplifier 84. The integrator capacitance 32 may be interconnected between the base of transistor 80 and the emitter of transistor 84 or between the base and the collector of transistor 80, or it may actually be both. A current source 86 is also included in integrator system 29. Gain stage 36 may be implemented by a differential amplifier including two NPN transistors 90 and 92 loaded by resistors 94 and 96, respectively. The emitters of each of transistors 90 and 92 are connected to current sources 98 and 100, respectively, and trimming resistor 52, shown as 55 ohms in this embodiment, is interconnected between the emitters of transistors 90 and 92. In this implementation the entire transimpedance amplifier 12 including trimming resistor 52 is disposed on a single integrated circuit chip. The positive output on line 38 from the collector of transistor 92 is delivered to follower circuit 40 which includes transistor 102 and current source 104. The negative output from gain stage 36 is derived from the collector of transistor 90 and is delivered to follower circuit 48 which includes current source 106 and transistor 108.

Figure 4:
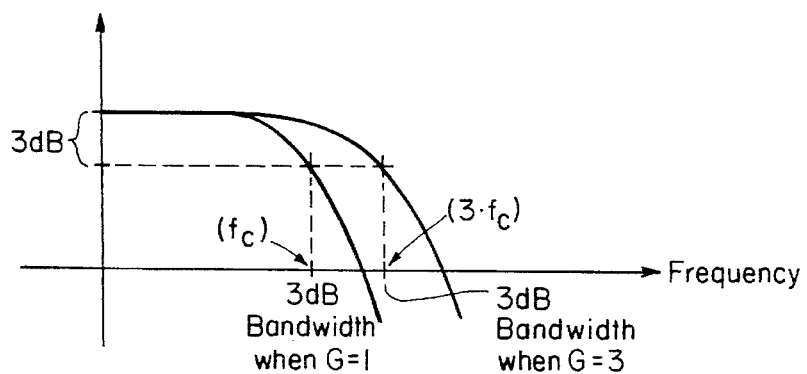
FIG. 4 is a graphical illustration of the increase in bandwidth obtainable using the transimpedance amplifier according to this invention.

The control of the bandwidth by the manipulation of the gain of gain stage 36 through the trimming of resistor 52 or 52' is illustrated in FIG. 4, where it can be seen for example that the bandwidth rolloff point 3 dB down from nominal gain, is represented at $f_c$. In FIG. 4 the ordinate is the logarithm of the transimpedance gain expressed in dB's and the abscissa is the log of the frequency. When the gain, of gain stage 36, is changed, for example increased, to a value of three, the rolloff point defining the bandwidth will now be 3 $f_c$ so that the bandwidth is increased by a factor of three directly in proportion to the increase in gain. The example using the gain of one and the gain of three described with respect to FIG. 4 is illustrative only, as typically the nominal gain such as three would be obtained during the process by setting the value of resistances and capacitances. Then the trimming would actually control the values in the plus and minus 20% tolerance range.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A transimpedance amplifier for an optical receiver comprising:

an integrator circuit for receiving a current input from a photodetector;

an integrator capacitance between an input and output of said integrator circuit;

a gain stage, responsive to said output of said integrator circuit, for providing an output voltage representative of the current input to said integrator circuit; and a feedback resistance connected between the output of said gain stage and said input of said integrator circuit for establishing the nominal gain of, and in conjunction with said integrator capacitance for setting the nominal bandwidth of, the transimpedance amplifier; where said gain stage increases the bandwidth by the factor of the gain.

2. The transimpedance amplifier for an optical receiver of claim 1 in which said gain stage includes a trimmable resistance to adjust the gain of said gain stage.

3. The transimpedance amplifier for an optical receiver of claim 2 in which the transimpedance amplifier is fabricated as an integrated circuit and said trimmable resistance is in said integrated circuit.

4. The transimpedance amplifier for an optical receiver of claim 2 in which the transimpedance amplifier is fabricated as an integrated circuit and said trimmable resistance is external to said integrated circuit.

5. The transimpedance amplifier for an optical receiver of claim 2 in which said trimmable resistance is approximately several orders of magnitude smaller than said feedback resistance.

6. A transimpedance amplifier for an optical receiver comprising:

an integrator circuit for receiving a current input from a photodetector;

an integrator capacitance between an input and output of said integrator circuit;

a gain stage, responsive to said output of said integrator circuit, for providing an output voltage representative of the current input to said integrator circuit; and a feedback resistance connected between the output of said gain stage and said input of said integrator circuit for establishing the nominal gain of, and in conjunction with said integrator capacitance for setting the nominal bandwidth of, the transimpedance amplifier;

said gain stage including a trimmable resistance for adjusting the gain of said gain stage to control the bandwidth of the transimpedance amplifier.

7. The transimpedance amplifier for an optical receiver of claim 6 in which the transimpedance amplifier is fabricated as an integrated circuit and said trimmable resistance is in said integrated circuit.

8. The transimpedance amplifier for an optical receiver of claim 6 in which the transimpedance amplifier is fabricated as an integrated circuit and said trimmable resistance is external to said integrated circuit.

9. The transimpedance amplifier for an optical receiver of claim 6 in which said trimmable resistance is approximately several orders of magnitude smaller than said feedback resistance.

\* \* \* \* \*